United States Patent
Sasaki (10) Patent No.: US 6,836,055 B2
(45) Date of Patent: Dec. 28, 2004

(54) PIEZOELECTRIC VIBRATOR AND FILTER USING THE SAME

(75) Inventor: Yukinori Sasaki, Nishinomiya (JP)

(73) Assignee: Matsushita Electric Industrial Co., Ltd. (JP)

(*) Notice: Subject to any disclaimer, the term of this patent is extended or adjusted under 35 U.S.C. 154(b) by 49 days.

(21) Appl. No.: 10/344,319
(22) PCT Filed: Jun. 10, 2002
(86) PCT No.: PCT/JP02/05723
§ 371 (c)(1),
(2), (4) Date: Mar. 18, 2003
(87) PCT Pub. No.: WO02/101923
PCT Pub. Date: Dec. 19, 2002

(65) Prior Publication Data
US 2003/0160545 A1 Aug. 28, 2003

(30) Foreign Application Priority Data
Jun. 11, 2001 (JP) ........................ 2001-175148

(51) Int. Cl.$^7$ ........................................ H01L 41/08
(52) U.S. Cl. ..................... 310/320; 310/358; 310/368
(58) Field of Search ................. 310/320, 334, 310/358, 360, 365, 367, 368

(56) References Cited
U.S. PATENT DOCUMENTS 3,582,839 A * 6/1971 Pim et al. ................... 333/191
4,870,313 A * 9/1989 Hirama et al. .............. 310/320
5,404,628 A * 4/1995 Ketcham ................... 29/25.35
6,396,200 B2 * 5/2002 Misu et al. ................. 310/348
6,437,484 B1 * 8/2002 Nishimura et al. ......... 310/324
6,556,103 B2 * 4/2003 Shibata et al. .............. 333/187

FOREIGN PATENT DOCUMENTS

| JP | 55-93315 | 7/1980 |
|----|----------|--------|
| JP | 58-190115 | 11/1983 |
| JP | 60-206311 | 10/1985 |
| JP | 62-220012 | 9/1987 |
| JP | 6-37579 | 2/1994 |
| JP | 7-203593 | 8/1995 |
| JP | 8-78985 | 3/1996 |
| JP | 8-242026 | 9/1996 |
| JP | 9-8594 | 1/1997 |

* cited by examiner

Primary Examiner—Mark Budd
(74) Attorney, Agent, or Firm—Parkhurst & Wendel, L.L.P.

(57) ABSTRACT

A piezoelectric vibrator uses aluminum nitride as piezoelectric material and thickness sliding vibration as the primary vibration. A polarization direction of the primary vibration is along the longitudinal direction of its vibrating element. This vibrator eliminates undesired resonance, caused by a width of the vibrating element, from a vicinity of a resonance frequency of the primary vibration. Vibrating element 1 has width W and thickness H defined as follows: $2.0 \leq W/H \leq 4.0$ or $4.3 \leq W/H \leq 5.7$ or $6.2 \leq W/H \leq 7.8$ or $8.2 \leq W/H \leq 9.8$.

8 Claims, 6 Drawing Sheets

PIEZOELECTRIC VIBRATOR AND FILTER USING THE SAME

TECHNICAL FIELD

The present invention relates to piezoelectric vibrators employing aluminum nitride as piezoelectric material, and it also relates to piezoelectric filters using the piezoelectric vibrator.

BACKGROUND ART

Figure 14:
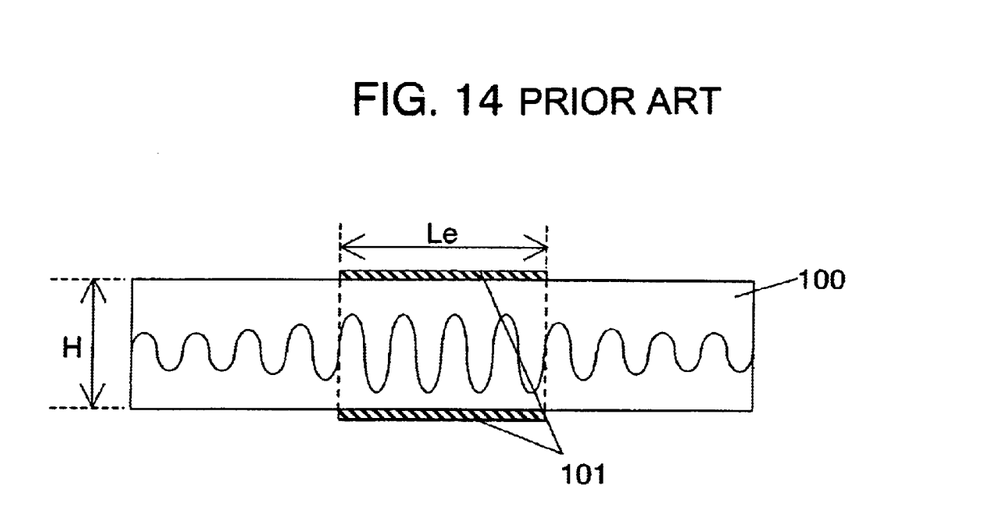
FIG. 14 shows a sectional view of a conventional piezoelectric vibrator that uses an energy-confinement phenomenon.

Piezoelectric vibration devices, which use bulk wave propagating through a solid body, include a piezoelectric vibrator to be used as a clock source of various electronic apparatuses and a piezoelectric filter to be used for extracting a frequency in a communication device. Recently a higher frequency has been used in those piezoelectric vibration devices. Thickness sliding vibration or thickness longitudinal vibration is used as primary vibration, and an energy confinement phenomenon, which is particularly effective for suppressing undesired vibrations and for holding the devices with ease, is often used in the piezoelectric vibration devices. The energy confinement phenomenon is to confine vibration energy only underneath an excitation electrode in the following case: The excitation electrode is formed at a portion on a partial principal plane of a vibrating element under the condition that a specific vibration mode such as thickness sliding vibration or thickness longitudinal vibration is used in a specific piezoelectric material. This phenomenon is analyzed exhaustively by Messrs. Shockley and Onoe. The energy confinement phenomenon is described hereinafter with reference to a sectional view of vibrating element 100 shown in FIG. 14. Assume that a cut-off frequency at a place of excitation electrode 101 is fo, and a cut-off frequency at a non-electrode section is fo'. Vibration energy propagates free from regulations when the frequency is higher than fo', and does not form standing wave even underneath excitation electrode 101. On the other hand, when the frequency is less than fo' and greater than fo, the vibration energy propagates free from regulations in a place of excitation electrode 101; however, the energy attenuates exponentially in the non-electrode section, as shown in FIG. 14. Vibration displacement thus becomes smaller as it approaches to the ends of vibrating element 100. As a result, the vibration energy concentrates on the vicinity of excitation electrode 101. At both the ends of vibrating element 100, the vibration displacement is small enough to suppress reflecting waves which occur at both the ends, so that the characteristics of the primary vibration, namely thickness longitudinal vibration or thickness sliding vibration, can be improved.

Uses of the energy confinement phenomenon, however, hardly suppress undesired resonance that is caused by a length or a width of the vibrating element. Therefore, the dimensions of the vibrating element need to be appropriate so that undesired resonance cannot occur at the vicinity of the resonance frequency of the primary vibration. For instance, Japanese Patent Gazette No. 1577973 teaches as follows: a strip-vibrator, of which primary vibration is thickness sliding vibration, uses X-cut of lithium tantalate, and when the following relation is satisfied, a frequency of undesired resonance due to a width of a vibrating element is away from the principal frequency resonance:

$1.35 \leq W/H \leq 3.0$, or $3.8 \leq W/H \leq 5.0$, where W is width of the vibrating element, and H is thickness of the vibrating element. As a result, the better characteristic can be obtained.

However, in the case of a piezoelectric vibrator using thickness sliding vibration as the primary vibration, aluminum nitride as piezoelectric material, and a polarization direction directed along the longitudinal direction of the vibrating element, the following problem occurs. No definite dimensions are available for moving away the undesired resonance, caused by the width of vibrating element, from the resonance frequency of the primary vibration.

DISCLOSURE OF THE INVENTION

A piezoelectric vibrator uses aluminum nitride as piezoelectric material, thickness sliding vibration as the primary vibration, and a polarization direction directed along the longitudinal direction of its vibrating element. Dimensions of the vibrating element are defined as follows:
$2.0 \leq W/H \leq 4.0$ or $4.3 \leq W/H \leq 5.7$ or $6.2 \leq W/H \leq 7.8$ or $8.2 \leq W/H \leq 9.8$, where W is a width of the vibrating element, and H is a thickness of the vibrating element.

DETAILED DESCRIPTION OF THE PREFERRED EMBODIMENTS

Exemplary embodiments of the present invention are demonstrated hereinafter with reference to the accompanying drawings. Similar elements in respective embodiments have the same reference marks.

Exemplary Embodiment 1

Figure 1:
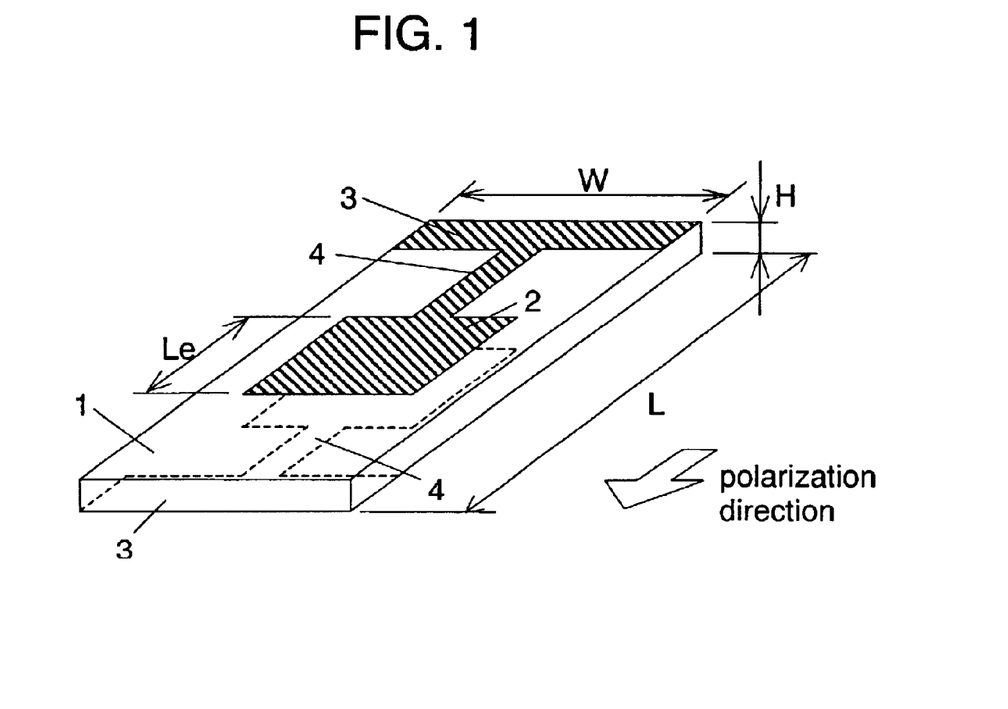
FIG. 1 shows a perspective view of a piezoelectric vibrator in accordance with a first exemplary embodiment of the present invention.
Figure 2:
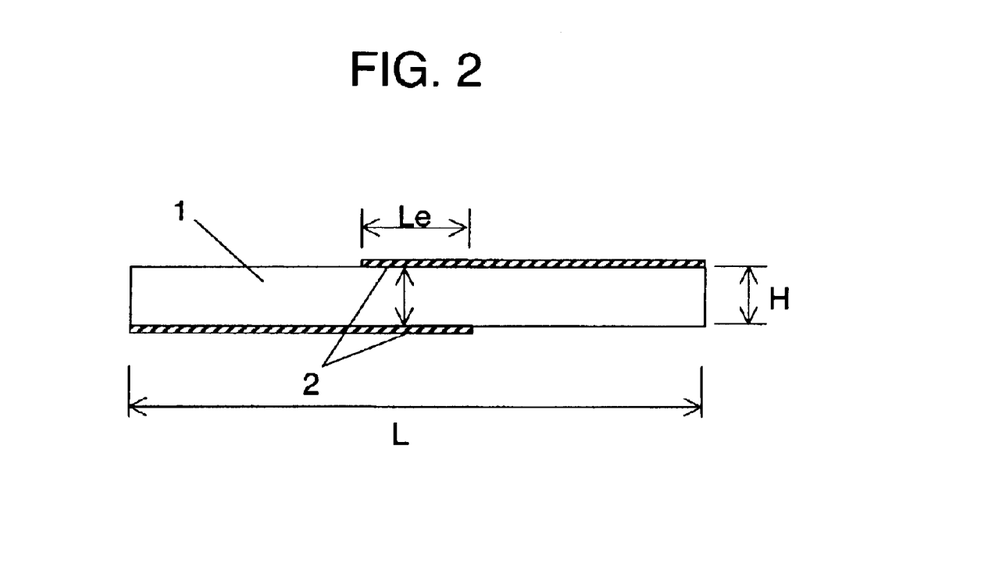
FIG. 2 shows a sectional view of the piezoelectric vibrator in accordance with the first exemplary embodiment of the present invention.

FIGS. 1 and 2 are a perspective view and a sectional view of a piezoelectric vibrator in accordance with the first embodiment of the present invention. This vibrator uses aluminum nitride as piezoelectric material and thickness sliding vibration as the primary vibration, and the polarization direction of the primary vibration is directed along the longitudinal direction of vibrating element 1. Excitation electrodes 2 are prepared oppositely to each other on both the surface and the underside of the principal plane of vibrating element 1. Excitation electrodes 2 are coupled to outer-connection electrode 3 via leader electrode 4.

In the piezoelectric vibrator structured above, vibration energy concentrates underneath excitation electrode 2 due to an energy confinement phenomenon and attenuates as it approaches to a longitudinal end of vibrating element 1. It is difficult for a use of the energy confinement phenomenon to suppress undesired resonance that is caused by dimensions, such as a width, of vibrating element 1. Therefore, the dimensions of element 1 need to be set appropriately not to generate undesired resonance at a vicinity of the resonance frequency of the primary vibration.

Figure 3:
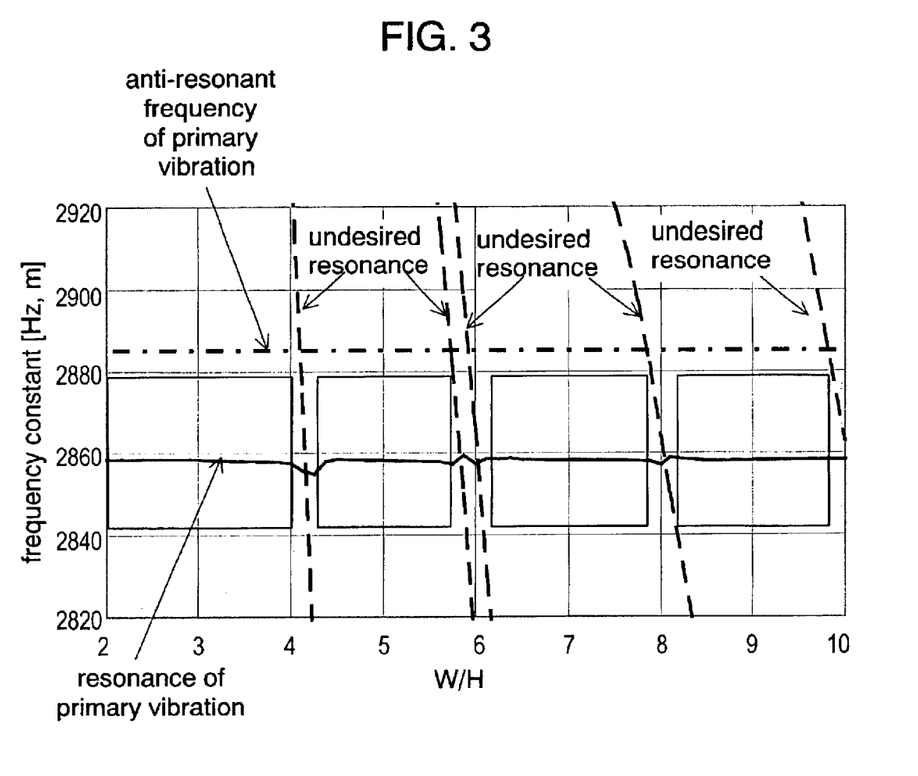
FIG. 3 illustrates relations between a ratio of W/H and a frequency constant of a primary vibration and undesired resonance, where W is a width of a vibrating element and H is a thickness of the vibrating element.

FIG. 3 is a frequency chart where resonance frequencies of primary vibration and undesired resonance, and anti-resonant frequency of the primary vibration are plotted responsive to changes of the width (W) of vibrating element 1. Vibrating element 1 is employed in the piezoelectric vibrator that uses aluminum nitride as piezoelectric material and thickness sliding vibration as the primary vibration, and the polarization direction of the primary vibration is directed along the longitudinal direction of vibrating element 1. In the frequency chart, the X axis represents the ratio of W/H, where H is a thickness of vibrating element 1, and the Y axis represents a frequency constant, namely, a product of multiplying the resonance frequencies of primary vibration or undesired resonance by thickness H. Plural vibrating elements having a constant H and various values of W are prepared. Resonance frequencies of the primary vibration and the undesired resonance of each one of those plural elements are measured and plotted on this coordinate, so that FIG. 3 is prepared.

A resonance frequency of the primary vibration which is sliding vibration, is in inverse proportion to thickness H of vibrating element 1, thus it keeps almost constant regardless of changes in W/H. The frequency constant of thickness sliding vibration in the first embodiment is approx. 2860 as shown with the solid line in FIG. 3. This value is proper to aluminum nitride, namely, piezoelectric material. The anti-resonance of the primary vibration has a frequency constant of approx. 2883 shown with the alternate long and short dash line in FIG. 3. This value also keeps almost constant regardless of changes in W/H. However, undesired resonance, e.g., width-bending vibration shown with the broken line in FIG. 3, changes in its resonance frequency as the width changes. At the vicinity of W/H=4.2, a frequency constant of the primary vibration thus becomes immediately close to that of the undesired resonance, so that the resonance frequency of the primary vibration becomes close to that of the undesired resonance. This case sometime causes an unstable phenomenon such as a frequency jump in an oscillating circuit.

Figure 4A:
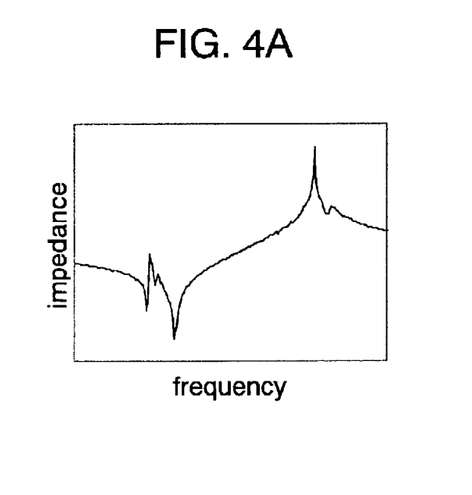
FIG. 4A shows impedance characteristics of a vibrator of which W/H is defined at 4.2.
Figure 4B:
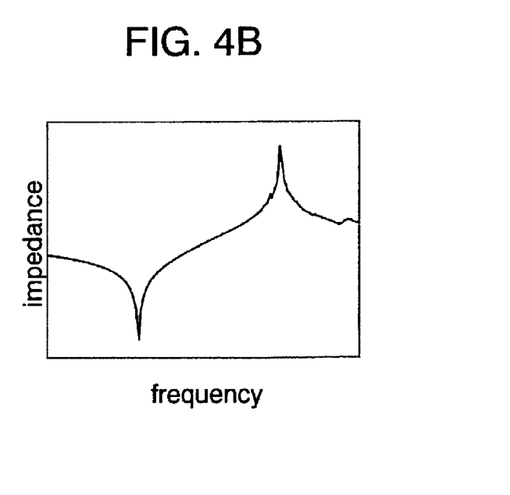
FIG. 4B shows impedance characteristics of the vibrator used in the first embodiment, where W/H is defined at 5.0.

As a result, no undesired resonance at a vicinity of the resonance of the primary vibration, to be more specific, no undesired resonance between frequency constants of 2840 and 2880 (including both the end values) realizes a piezoelectric vibrator having excellent characteristics. In FIG. 3, respective rectangular regions cover the frequency constant range in which no undesired resonance should exist at the vicinity of resonance of the primary vibration. When the value of W/H falls within any one of the following ranges, the undesired resonance does not exist in the foregoing frequency constant range:

$2.0 \leq W/H \leq 4.0$, $4.3 \leq W/H \leq 5.7$, $6.2 \leq W/H \leq 7.8$, or $8.2 \leq W/H \leq 9.8$ FIGS. 4A and 4B show impedance characteristics of vibrating element 1 as an example, where thickness H=0.1 mm, width W=0.42 mm and 0.50 mm are tested. FIG. 4A shows the case of W=0.42 mm, namely, in the case of vibrating element 1 having W/H=4.2, undesired resonance exists at the vicinity of the resonance of the primary vibration. On the other hand, in the case of W=0.50 mm as shown in FIG. 4B, namely, when vibrating element 1 has W/H=5.0, no undesired resonance exist in the vicinity of the resonance of the primary vibration, so that the better characteristics are obtainable.

As discussed above, vibrating element 1 is employed in the piezoelectric vibrator that uses aluminum nitride as piezoelectric material, thickness sliding vibration as the primary vibration, and the polarization direction directed along the longitudinal direction of vibrating element 1. In this piezoelectric vibrator, setting the dimensions of vibrating element 1, such that the ratio of W/H falls within one of the following ranges, makes the vibrator of better characteristics: $2.0 \leq W/H \leq 4.0$, $4.3 \leq W/H \leq 5.7$, $6.2 \leq W/H \leq 7.8$, or $8.2 \leq W/H \leq 9.8$, where W is a width and H is a thickness of vibrating element 1.

On the other hand, in the case of the length (L) of vibrating element 1 being not long enough, vibration displacement does not yet decrease to a level small enough at the longitudinal ends, so that reflected wave occurs, which lowers a mechanical quality factor of the primary vibration resonance.

Figure 5:
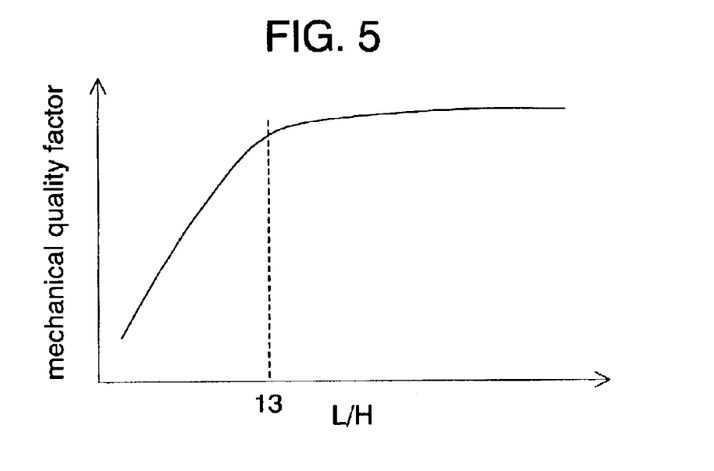
FIG. 5 shows a relation between L/H and mechanical quality factor, where L is a length of a vibrating element and H is a thickness of the vibrating element.

FIG. 5 shows a relation between length L of vibrating element 1 and a mechanical quality factor. Since thickness H of vibrating element 1 is inversely proportionate to a frequency of the primary vibration resonance, the X axis in FIG. 5 represents length L normalized with thickness H. As a result, the relation between length L and the mechanical quality factor can be handled regardless of a frequency range to be used. As shown in FIG. 5, in case that the ratio of L/H becomes smaller than 13, the mechanical quality factor sharply decreases. Thus setting a value of L/H at greater than 13 can attenuate the vibration displacement at the longitudinal ends of element 1 enough, so that the reflected wave is suppressed, which prevents the mechanical quality factor of the primary vibration resonance from being lowered.

Figure 6:
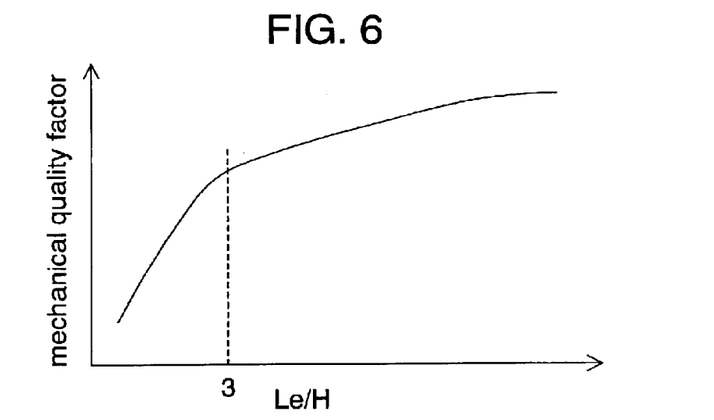
FIG. 6 shows a relation between Le/H and mechanical quality factor, where Le is a length of an excitation electrode and H is a thickness of a vibrating element.

Next, a ratio of Le/H is studied, where Le is a length of excitation electrode 2, and H is a thickness of vibrating element 1. FIG. 6 shows a relation between Le and a mechanical quality factor. The X axis in FIG. 6 is also normalized with thickness H similarly to FIG. 5. As shown in FIG. 6, when Le/H becomes smaller than 3, the mechanical quality factor sharply lowers because the degrading factors such as damaged layers or micro-cracks have relatively greater influence at a smaller area of exciting electrode 2. Meanwhile, the foregoing degrading factors such as damaged layers or micro-cracks are produced on the surface of element 1 by processing element 1.

Unnecessarily large excitation electrode 2 requires a longer length L of element 1 in order to attenuate the vibration displacement at the longitudinal ends, thus a large size electrode 2 restrains element 1 from shortening its length. Thus the upper limit of Le/H is set at 12 that is smaller than the lower limit of optimum value (13) of L/H. The discussion above concludes that the optimum value of Le/H is between 3 and 12 (including both the end values), namely, $3 \leq Le/H \leq 12$.

To be more specific, the following piezoelectric vibrator could be an example. A piezoelectric vibrator, of which vibrating element 1 has a thickness H of 200 μm, has a resonance frequency of approx. 14 MHz. When width W of vibrating element 1 is set at 1 mm, a ratio of W/H is 5.0, and no undesired resonance caused by the width of element 1 exist at a vicinity of the primary vibration resonance. As a result, stable characteristics can be expected. When length L of element 1 is set at 3 mm, a ratio of L/H is 15, more than the lower limit 13. Setting length Le of excitation electrode 2 at 1 mm makes Le/H at 5, more than the lower limit 3. Both of the ratios restrain the mechanical quality factor from lowering.

Exemplary Embodiment 2

Figure 7:
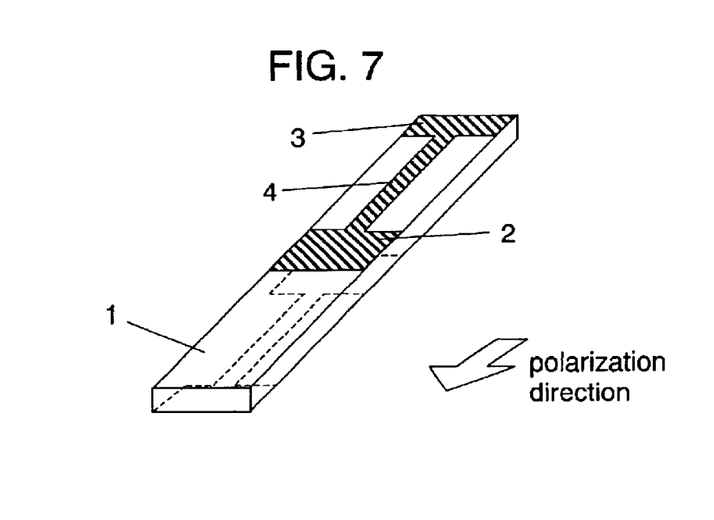
FIG. 7 shows a strip-vibrator in accordance with a second exemplary embodiment of the present invention.

FIG. 7 shows a perspective view of a strip piezoelectric vibrator in accordance with the second exemplary embodiment. A strip structure is known as a method for downsizing piezoelectric vibrators. FIG. 7 shows a strip structure, i.e., a sectional view of vibrating element 1 is rectangular, and excitation electrode 2 is formed extending over the entire width of element 1, so that energy is not confined widthwise. When electrode 2 is not at a symmetrical place in the principal plane with respect to the width direction, the structure shown in FIG. 1 discussed previously generates sometimes undesired resonance caused by the asymmetrical structure, and incurs degradation in the characteristics. An adoption of the strip structure to the piezoelectric vibrator discussed above (using aluminum nitride, thickness sliding vibration, and polarization along the longitudinal direction of element 1) can suppress undesired resonance caused by misregistration of electrode 2, and yet it can downsize the vibrator.

Exemplary Embodiment 3

Figure 8:
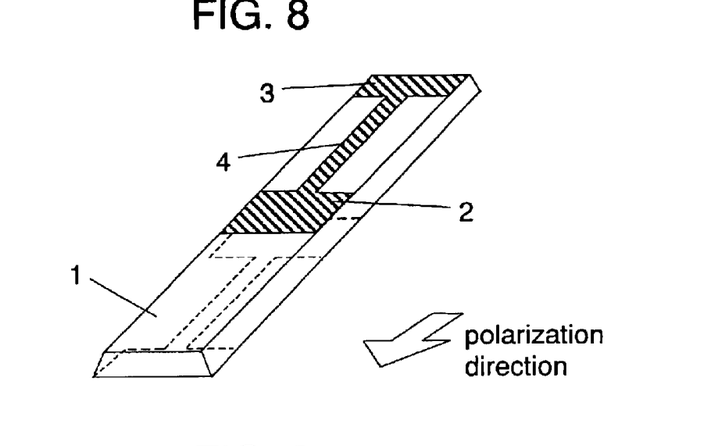
FIG. 8 shows a vibrator, of which vibrating element is tapered in width direction, in accordance with a third exemplary embodiment of the present invention.

FIG. 8 shows a perspective view of a strip piezoelectric vibrator in accordance with the third embodiment. Vibrating element 1 is tapered at both the ends in the width direction. As discussed in the second embodiment, a sectional view of vibrating element 1 shows rectangular in a strip structure. However, the sectional view is not always shaped in a rectangle but it becomes a trapezoid or a parallelogram depending on a production process, so that the end face of element 1 is tapered. Since vibration displacement in a longitudinal direction is sufficiently attenuated due to an energy confinement phenomenon, the tapered ends in the longitudinal direction of element 1 hardly influences optimum design values. However tapered ends in the width direction, namely, an angle formed by the principal plane of element 1 and a side face of element 1 in the width direction deviates substantially from 90 degrees, the vibration of undesired resonance caused by the width dimension of element 1 changes. This change incurs adverse influences such as changes in the resonance frequency or production of new undesired resonance. However, if the angle formed by the principal plane of element 1 and the side face in the width direction of element 1 takes a value of 90°±10° namely, from 80° to 100° (including both the end values), the sectional view of element 1 in the width direction can be treated as almost a rectangle. Therefore, the optimum design values are applicable as they are.

To be specific, the following piezoelectric vibrator is described as an example:

thickness H of vibrating element 1=100 μm width W of the upper face of the principal plane of element 1=350 μm length L of element 1=2 mm length Le of excitation electrode=1 mm.

In this vibrator, W/H=3.5, L/H=20, and Le/H=10. The end faces of vibrating element 1 in the width direction are tapered, and the sectional view of the end faces is shaped in trapezoid instead of rectangle. The angle formed by the upper face of the principal plane and the side face in the width direction of element 1 measures 95°, i.e., within the range of 80–100° Therefore, the piezoeleotric vibrator having the foregoing dimensions does not have undesired resonance at a vicinity of the primary vibration resonance, and excellent characteristics including a greater mechanical quality factor can be achieved.

Exemplary Embodiment 4

Figure 9:
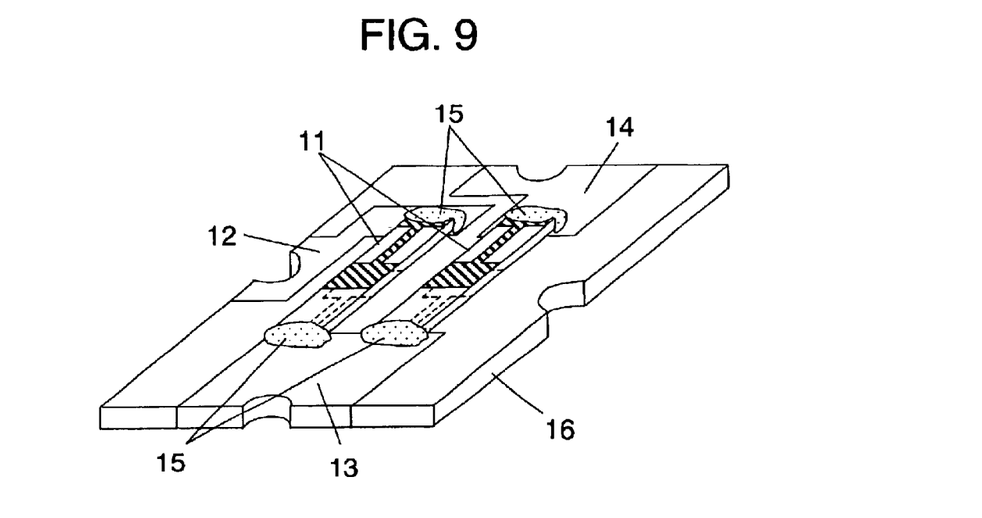
FIG. 9 shows a perspective view of a ladder filter in accordance with a fourth exemplary embodiment of the present invention.

FIG. 9 shows a perspective view of a ladder filter in accordance with the fourth embodiment. Two piezoelectric vibrators 11 are coupled to outer outputting terminal 13, first piezoelectric vibrator 11 is coupled to outer inputting terminal 12, and second piezoelectric vibrator 11 is coupled to outer grounding terminal 14. Conductive resin 15 is used for those couplings. Board 16 holds the foregoing elements.

Plural vibrators are combined to form a band-pass filter that allows a signal of a specific frequency band to pass through. If a vibrator has an undesired resonance between its resonance frequency and its anti-resonant frequency, such a filter cannot perform good characteristics because ripples exist in the pass band. When individual vibrators that form the filter have small mechanical quality factors, the filter sometimes incurs greater insertion loss. However, a combination of the vibrators demonstrated in the previous embodiments can produce excellent filter characteristics. Because each one of the vibrators has stable characteristics free from undesired resonance, so that no ripples exist in the pass band, and the vibrators have greater mechanical quality factors. As a result, an excellent filter with smaller insertion loss can be expected.

To be specific, the following filter is described as embodiment: Each one of the two piezoelectric vibrators used for the filter has the following dimensions:

thickness H of the vibrating element=100 μm, width W of the vibrating element=350 μm, length L of the vibrating element=2 mm, and length Le of the excitation electrode=1 mm.

Those dimensions result in W/H=3.5, L/H=20, and Le/H=10. Thus no undesired resonance exists at a vicinity of the primary vibration of each one of the vibrators, and no ripples exist in the pass band. In addition, a greater mechanical quality factor of each one of the vibrators reduces the insertion loss of the filter. As a result, the filter of excellent characteristics is obtainable.

Exemplary Embodiment 5

Figure 10:
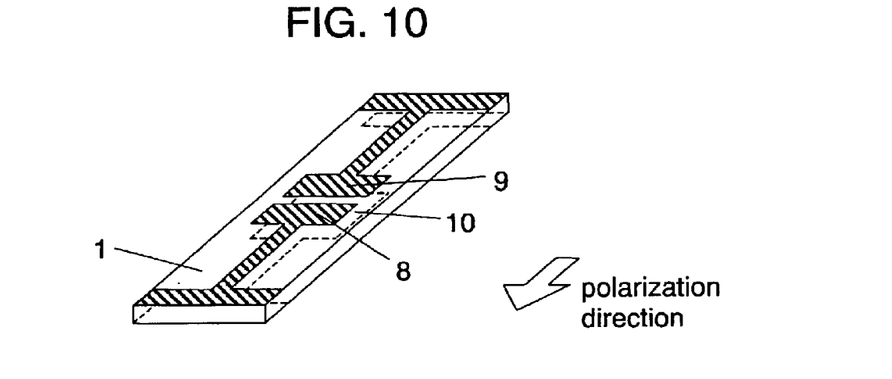
FIG. 10 shows a perspective view of a dual-mode filter in accordance with a fifth exemplary embodiment of the present invention.

FIG. 10 shows a perspective view of a dual mode filter in accordance with the fifth embodiment. Input electrode 8 and output electrode 9 are disposed on a first principal plane, and grounding electrode 10 is disposed on a second principal plane of vibrating element 1.

A multi-mode filter can be used besides the ladder filter described in the fourth embodiment. The multi-mode filter is formed in this way: Plural piezoelectric vibrators are formed on a single vibrating element 1, and the vibrations of those vibrators are coupled, thereby forming a band-pass filter.

The multi-mode filter is referred to as monolithic crystal filter (MCF) and positively adopts inharmonic overtone such as a_0 mode or s_1 mode. The fifth embodiment describes the dual-mode filter adopting s_0 mode and a_0 mode.

Figure 11:
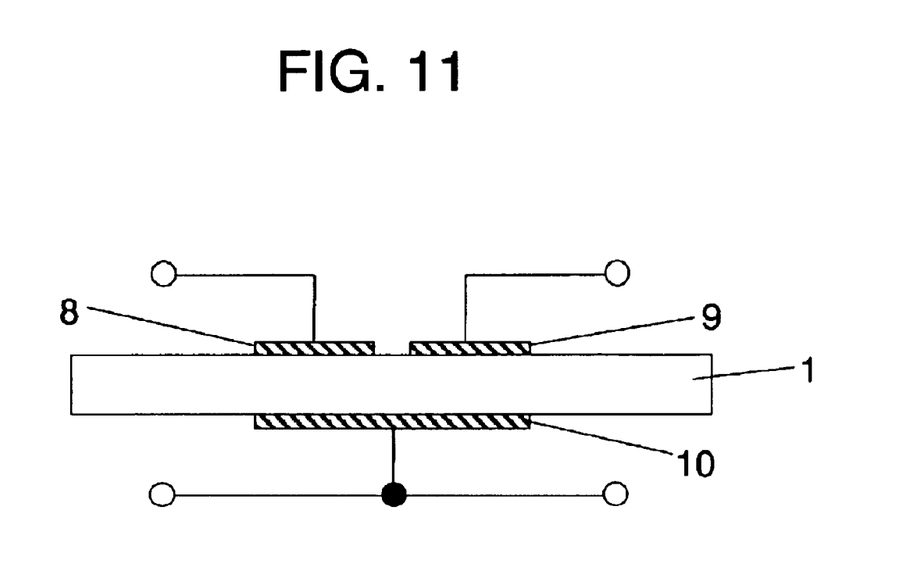
FIG. 11 shows a a sectional view of the dual-mode filter in accordance with the fifth embodiment of the present invention.

FIG. 11 shows a sectional view in the longitudinal direction of vibrating element 1 of the dual-mode filter. As shown in FIG. 11, the dual-mode filter has input electrode 8 and output electrode 9 with a fine interval between them on the first principal plane of element 1. Grounding electrode 10 is disposed on the second principal plane. This structure generates symmetric s_0 mode and asymmetric a_0 mode, thereby realizing a band-pass filter.

Figure 12:
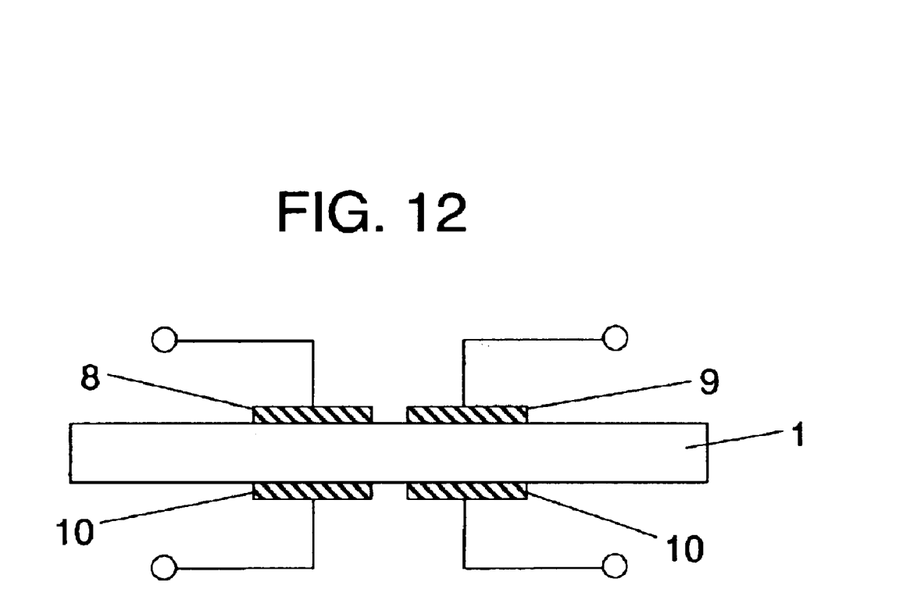
FIG. 12 shows a sectional view of another dual-mode filter in accordance with the fifth embodiment of the present invention.

FIG. 11 shows only one grounding electrode 10; however, as shown in FIG. 12, two grounding electrodes 10 can be prepared for input electrode 8 and output electrode 9 such that each electrode 10 is opposite to electrodes 8 and 9 respectively.

In a similar way to the ladder filter previously discussed, a ratio of W/H can be set such that no undesired resonance due to the width of element 1 exist at the vicinity of a resonance of a vibration mode to be adopted. This ratio of W/H results in producing a dual-mode filter free from ripples in its pass band and having excellent characteristics.

To be specific, the following filter can be taken as embodiment: Thickness H of vibrating element 1 is 10 $\mu$m, thus the center frequency of the filter is ca. 280 MHz. Width W of element 1 is 65 $\mu$m and W/H is 6.5. Therefore, undesired resonance caused by a width of element 1 does not exist at a vicinity of the resonance of a vibrating mode to be adopted. The filter thus has excellent characteristics and no ripples exist in its pass band.

Exemplary Embodiment 6

Figure 13:
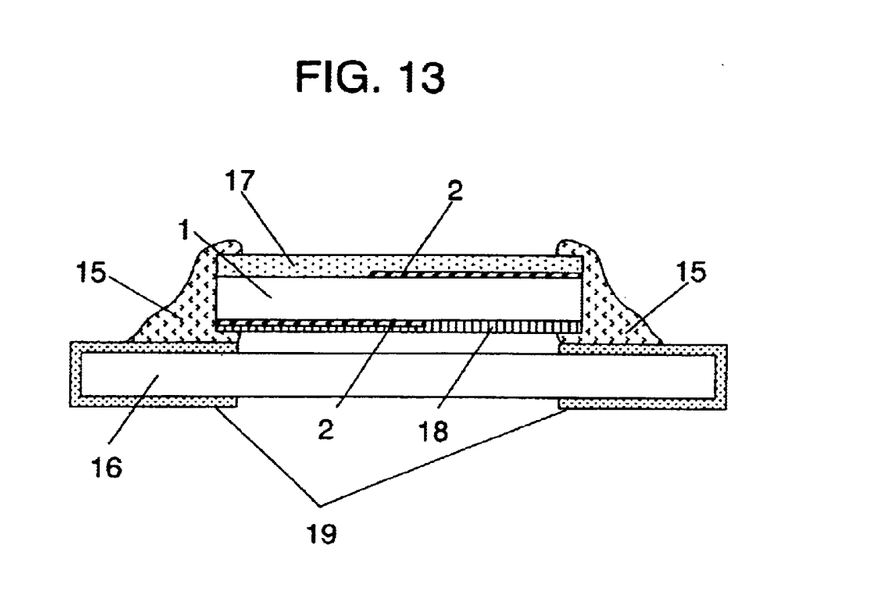
FIG. 13 shows a sectional view of a board on which a piezoelectric vibrator, in accordance with a sixth exemplary embodiment of the present invention, is mounted.

FIG. 13 shows a sectional view of a board where a piezoelectric vibrator in accordance with the sixth embodiment is mounted. Excitation electrodes 2 are disposed oppositely to each other on both the front face and the back face of element 1. Silicon dioxide film 17 is formed on the front face, and silicon nitride film 18 is formed on the back face. Outer terminal 19 prepared on board 16 is coupled to excitation electrode 2 via conductive resin 15.

Aluminum nitride, described above as piezoelectric material to be used for piezoelectric vibrators or piezoelectric filters, has thickness as thin as 2 $\mu$m. Protective film such as silicon dioxide film or silicon nitride film is formed on a front face, a back face, or both the faces of a piezoelectric plate made of aluminum nitride, so that the reliability of the plate increases. For instance, the plate becomes mechanically strengthened and undergoes less aged deterioration in electrical properties.

This structure is applicable to the piezoelectric vibrations described in embodiments 1 through 3 as well as the piezoelectric filters described in embodiments 4 and 5.

Industrial Applicability

A piezoelectric vibrator uses aluminum nitride as piezoelectric material, thickness sliding vibration as the primary vibration, a polarization direction directed in the longitudinal direction of its vibrating element. Dimensions of the vibrating element are defined as follows: $2.0 \leq W/H \leq 4.0$ or $4.3 \leq W/H \leq 5.7$ or $6.2 \leq W/H \leq 7.8$ or $8.2 \leq W/H \leq 9.8$, where W is a width of the vibrating element, and H is a thickness of the vibrating element. This structure eliminates undesired resonance, caused by a width of the vibrating element, from a vicinity of the resonance frequency of the primary vibration, so that excellent characteristics can be obtained.

What is claimed is:

1. A piezoelectric vibrator including a vibrating element of which piezoelectric material is aluminum nitride, the vibrator employing thickness sliding vibration as primary vibration of which polarization is directed along a longitudinal direction of the vibrating element, and a ratio of width W vs. thickness H of the vibrating element falling within one of ranges of: $2.0 \leq W/H \leq 4.0$, $4.3 \leq W/H \leq 5.7$, $6.2 \leq W/H \leq 7.8$ and $8.2 \leq W/H \leq 9.8$.

2. The piezoelectric vibrator of claim 1, wherein a ratio of length L vs. thickness H of the vibrating element is at least 13, i.e., $13 \leq L/H$.

3. The piezoelectric vibrator of claim 1, wherein a principal plane of the vibrating element has a pair of excitation electrodes, and a ratio of length Le of each one of the excitation electrodes vs. thickness H of the vibrating element falls within a range between 3 and 12, i.e., $3 \leq Le/H \leq 12$.

4. The piezoelectric vibrator of claim 1, further comprising a pair of excitation electrodes extending over an entire width of a principal plane of the vibrating element, wherein a sectional view of the vibrating element shapes in a rectangle.

5. The piezoelectric vibrator of claim 1, wherein an angle, formed by a principal plane of the vibrating element and a side face in a width direction of the vibrating element, falls within a range from not less than 80° to not more than 100°.

6. The piezoelectric vibrator of claim 1, wherein further comprising film covering at least one of principal planes of the vibrating element, and the film is made from one of silicon dioxide film and silicon nitride film.

7. A ladder filter including at least two piezoelectric vibrators as defined in claim 1.

8. A dual-mode filter comprising a vibrating element of which piezoelectric material is aluminum nitride, the vibrating element employing thickness sliding vibration as primary vibration of which polarization is directed along a longitudinal direction of the vibrating element, a ratio of width W vs. thickness H of the vibrating element falling within one of ranges of: $2.0 \leq W/H \leq 4.0$, $4.3 \leq W/H \leq 5.7$, $6.2 \leq W/H \leq 7.8$ and $8.2 \leq W/H \leq 9.8$, and a first principal plane of the vibrating element is equipped with a set of an input electrode and an output electrode, and a second principal plane of the vibrating element is equipped with a grounding electrode.

* * * * *